(12) United States Patent
Inoue et al.

(10) Patent No.: US 10,050,412 B2
(45) Date of Patent: Aug. 14, 2018

(54) SEMICONDUCTOR LASER ELEMENT AND SEMICONDUCTOR LASER DEVICE

(71) Applicant: USHIO DENKI KABUSHIKI KAISHA, Tokyo (JP)

(72) Inventors: Yutaka Inoue, Tokyo (JP); Satoshi Kawanaka, Tokyo (JP); Hiroaki Uehara, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/633,801

(22) Filed: Jun. 27, 2017

(65) Prior Publication Data
US 2017/0373464 A1    Dec. 28, 2017

(30) Foreign Application Priority Data

Jun. 28, 2016   (JP) ................................ 2016-127401

(51) Int. Cl.
*H01S 5/028* (2006.01)
*H01S 5/323* (2006.01)
*H01S 5/12* (2006.01)
*H01L 21/02* (2006.01)
*H01S 5/026* (2006.01)
*H01S 5/042* (2006.01)

(52) U.S. Cl.
CPC .............. *H01S 5/026* (2013.01); *H01S 5/042* (2013.01); *H01S 5/12* (2013.01)

(58) Field of Classification Search
CPC ..................................................... H01S 5/042
USPC .............................. 372/38.07, 49.01; 257/98
See application file for complete search history.

(56) References Cited

U.S. PATENT DOCUMENTS

| 5,721,752 A * | 2/1998 | Takagi .................... H01S 5/028 372/21 |
| 6,370,177 B1 | 4/2002 | Genei et al. |
| 6,667,187 B2 | 12/2003 | Genei et al. |

FOREIGN PATENT DOCUMENTS

JP    2971435 B2    11/1999

OTHER PUBLICATIONS

Hiroshi Kubota; "Applied Optics"; 1959; pp. 92-97; Iwanami Zensho Publishing Co. Ltd.; Japan; with English language concise explanation.

* cited by examiner

*Primary Examiner* — Tuan Nguyen
(74) *Attorney, Agent, or Firm* — Studebaker & Brackett PC

(57) ABSTRACT

Disclosed herein is a semiconductor laser element capable of suppressing a wavelength dependency of a reflection ratio. A reflective film of the semiconductor laser element includes an $L_1$ layer arranged at a first position from the end faces of the resonator and having a refractive index of n1; and a periodic structure configured by layering a plurality of pairs of an $L_{2N}$ layer and an $L_{2N+1}$ layer. The $L_{2N}$ layer has a refractive index of n2, and the $L_{2N+1}$ layer has a refractive index of n3, where n2<n3. The L1 layer has a linear expansion coefficient of ±30% with respect to a linear expansion coefficient of the substrate and is made of a film having an optical film thickness thinner than $\lambda/4$. An $L_2$ layer arranged at a second position from the end faces of the resonator is made of a film having an optical film thickness thinner than $\lambda/4$.

16 Claims, 23 Drawing Sheets

FIG. 4

| EXAMPLE 1 | | |
|---|---|---|
| LAYER No. | MATERIAL | FILM THICKNESS [nm] |
| 10 | $Al_2O_3$ | $\lambda/4n$ |
| 9 | $SiN_x$ | $\lambda/4n$ |
| 8 | $SiO_2$ | $\lambda/4n$ |
| 7 | $SiN_x$ | $\lambda/4n$ |
| 6 | $SiO_2$ | $\lambda/4n$ |
| 5 | $SiN_x$ | $\lambda/4n$ |
| 4 | $SiO_2$ | $\lambda/4n$ |
| 3 | $SiN_x$ | $\lambda/4n$ |
| 2 | $SiO_2$ | 82.0 |
| 1 | $Al_2O_3$ | 30.0 |
| SEMICONDUCTOR LASER END FACE (WAVEGUIDE) | | |

FIG. 6

| EXAMPLE 2 | | |
|---|---|---|
| LAYER No. | MATERIAL | FILM THICKNESS [nm] |
| 12 | $Al_2O_3$ | $\lambda/4n$ |
| 11 | $SiN_x$ | $\lambda/4n$ |
| 10 | $SiO_2$ | $\lambda/4n$ |
| 9 | $SiN_x$ | $\lambda/4n$ |
| 8 | $SiO_2$ | $\lambda/4n$ |
| 7 | $SiN_x$ | $\lambda/4n$ |
| 6 | $SiO_2$ | $\lambda/4n$ |
| 5 | $SiN_x$ | $\lambda/4n$ |
| 4 | $SiO_2$ | $\lambda/4n$ |
| 3 | $SiN_x$ | $\lambda/4n$ |
| 2 | $SiO_2$ | 84.0 |
| 1 | $Al_2O_3$ | 30.0 |
| SEMICONDUCTOR LASER END FACE (WAVEGUIDE) | | |

FIG. 8

| | EXAMPLE 3 | |
|---|---|---|
| LAYER No. | MATERIAL | FILM THICKNESS [nm] |
| 16 | $Al_2O_3$ | $\lambda/4n$ |
| 15 | $TiO_2$ | $\lambda/4n$ |
| 14 | $SiO_2$ | $\lambda/4n$ |
| 13 | $TiO_2$ | $\lambda/4n$ |
| 12 | $SiO_2$ | $\lambda/4n$ |
| 11 | $TiO_2$ | $\lambda/4n$ |
| 10 | $SiO_2$ | $\lambda/4n$ |
| 9 | $TiO_2$ | $\lambda/4n$ |
| 8 | $SiO_2$ | $\lambda/4n$ |
| 7 | $TiO_2$ | $\lambda/4n$ |
| 6 | $SiO_2$ | $\lambda/4n$ |
| 5 | $TiO_2$ | $\lambda/4n$ |
| 4 | $SiO_2$ | $\lambda/4n$ |
| 3 | $TiO_2$ | $\lambda/4n$ |
| 2 | $SiO_2$ | 89.0 |
| 1 | $Al_2O_3$ | 30.0 |
| SEMICONDUCTOR LASER END FACE (WAVEGUIDE) | | |

FIG. 10

| EXAMPLE 4 | | |
|---|---|---|
| LAYER No. | MATERIAL | FILM THICKNESS [nm] |
| 16 | $SiO_2$ | $\lambda/4n$ |
| 15 | $TiO_2$ | $\lambda/4n$ |
| 14 | $SiO_2$ | $\lambda/4n$ |
| 13 | $TiO_2$ | $\lambda/4n$ |
| 12 | $SiO_2$ | $\lambda/4n$ |
| 11 | $TiO_2$ | $\lambda/4n$ |
| 10 | $SiO_2$ | $\lambda/4n$ |
| 9 | $TiO_2$ | $\lambda/4n$ |
| 8 | $SiO_2$ | $\lambda/4n$ |
| 7 | $TiO_2$ | $\lambda/4n$ |
| 6 | $SiO_2$ | $\lambda/4n$ |
| 5 | $TiO_2$ | $\lambda/4n$ |
| 4 | $SiO_2$ | $\lambda/4n$ |
| 3 | $TiO_2$ | $\lambda/4n$ |
| 2 | $SiO_2$ | 89.0 |
| 1 | $Al_2O_3$ | 30.0 |
| SEMICONDUCTOR LASER END FACE (WAVEGUIDE) | | |

FIG. 12

| EXAMPLE 5 | | |
|---|---|---|
| LAYER No. | MATERIAL | FILM THICKNESS [nm] |
| 6 | $SiO_2$ | $\lambda/4n$ |
| 5 | $TiO_2$ | $\lambda/4n$ |
| 4 | $SiO_2$ | $\lambda/4n$ |
| 3 | $TiO_2$ | $\lambda/4n$ |
| 2 | $SiO_2$ | 65.0 |
| 1 | $Al_2O_3$ | 50.0 |
| SEMICONDUCTOR LASER END FACE (WAVEGUIDE) | | |

FIG. 14

| COMPARATIVE EXAMPLE 1 |||
|---|---|---|
| LAYER No. | MATERIAL | FILM THICKNESS [nm] |
| 9 | $SiO_2$ | $\lambda/4n$ |
| 8 | $SiN_x$ | $\lambda/4n$ |
| 7 | $SiO_2$ | $\lambda/4n$ |
| 6 | $SiN_x$ | $\lambda/4n$ |
| 5 | $SiO_2$ | $\lambda/4n$ |
| 4 | $SiN_x$ | $\lambda/4n$ |
| 3 | $SiO_2$ | $\lambda/4n$ |
| 2 | $SiN_x$ | $\lambda/4n$ |
| 1 | $Al_2O_3$ | $\lambda/4n$ |
| SEMICONDUCTOR LASER END FACE (WAVEGUIDE) |||

FIG. 16

| COMPARATIVE EXAMPLE 2 | | |
|---|---|---|
| LAYER No. | MATERIAL | FILM THICKNESS [nm] |
| 9 | $SiO_2$ | $\lambda/2n$ |
| 8 | $SiN_x$ | $\lambda/4n$ |
| 7 | $SiO_2$ | $\lambda/4n$ |
| 6 | $SiN_x$ | $\lambda/4n$ |
| 5 | $SiO_2$ | $\lambda/4n$ |
| 4 | $SiN_x$ | $\lambda/4n$ |
| 3 | $SiO_2$ | $\lambda/4n$ |
| 2 | $SiN_x$ | $\lambda/4n$ |
| 1 | $Al_2O_3$ | $\lambda/4n$ |
| SEMICONDUCTOR LASER END FACE (WAVEGUIDE) | | |

FIG. 18

| EXAMPLE 6 | | |
|---|---|---|
| LAYER No. | MATERIAL | FILM THICKNESS [nm] |
| 12 | $SiO_2$ | $\lambda/4n$ |
| 11 | $\alpha$-Si | $\lambda/4n$ |
| 10 | $SiO_2$ | $\lambda/4n$ |
| 9 | $SiN_x$ | $\lambda/4n$ |
| 8 | $SiO_2$ | $\lambda/4n$ |
| 7 | $SiN_x$ | $\lambda/4n$ |
| 6 | $SiO_2$ | $\lambda/4n$ |
| 5 | $SiN_x$ | $\lambda/4n$ |
| 4 | $SiO_2$ | $\lambda/4n$ |
| 3 | $SiN_x$ | $\lambda/4n$ |
| 2 | $SiO_2$ | 84.0 |
| 1 | $Al_2O_3$ | 30.0 |
| SEMICONDUCTOR LASER END FACE (WAVEGUIDE) | | |

FIG. 20

| EXAMPLE 7 | | |
|---|---|---|
| LAYER No. | MATERIAL | FILM THICKNESS [nm] |
| 12 | $SiO_2$ | $\lambda/4n$ |
| 11 | $SiN_x$ | $\lambda/4n$ |
| 10 | $SiO_2$ | $\lambda/4n$ |
| 9 | $SiN_x$ | $\lambda/4n$ |
| 8 | $SiO_2$ | $\lambda/4n$ |
| 7 | $SiN_x$ | $\lambda/4n$ |
| 6 | $SiO_2$ | $\lambda/4n$ |
| 5 | $SiN_x$ | $\lambda/4n$ |
| 4 | $SiO_2$ | $\lambda/4n$ |
| 3 | α-Si | $\lambda/4n$ |
| 2 | $SiO_2$ | 84.0 |
| 1 | $Al_2O_3$ | 30.0 |
| SEMICONDUCTOR LASER END FACE (WAVEGUIDE) | | |

FIG. 22

| COMPARATIVE EXAMPLE 3 | | |
|---|---|---|
| LAYER No. | MATERIAL | FILM THICKNESS [nm] |
| 9 | $SiO_2$ | $\lambda/4n$ |
| 8 | $\alpha$-Si | $\lambda/4n$ |
| 7 | $SiO_2$ | $\lambda/4n$ |
| 6 | $SiN_x$ | $\lambda/4n$ |
| 5 | $SiO_2$ | $\lambda/4n$ |
| 4 | $SiN_x$ | $\lambda/4n$ |
| 3 | $SiO_2$ | $\lambda/4n$ |
| 2 | $SiN_x$ | $\lambda/4n$ |
| 1 | $Al_2O_3$ | $\lambda/4n$ |
| SEMICONDUCTOR LASER END FACE (WAVEGUIDE) | | |

SEMICONDUCTOR LASER ELEMENT AND SEMICONDUCTOR LASER DEVICE

FIELD OF THE INVENTION

The present invention relates to a semiconductor laser element and a semiconductor laser device incorporating the semiconductor laser element.

DESCRIPTION OF THE RELATED ART

Conventionally, in order to attain a higher output power and a lower threshold current or the like of a semiconductor laser, a certain type of semiconductor laser has been widely used in which an end face thereof is coated with multi-layered highly reflective film that is configured by layering (laminating) a plurality of pairs of a low reflective index film and a high reflective index film alternately.

For example, Patent Literature 1 discloses a certain type of multi-layered highly reflective film that has a total layer number equal to or less than nine and configured by layering, on a first low refractive index film, a plurality of pairs of a first high refractive index film and a second low refractive index film alternately. The first low refractive index film has a linear expansion coefficient within ±30% with respect to a linear expansion coefficient of a crystalline (crystal) substrate of the semiconductor laser. The first low refractive index film also has an optical film thickness of $\lambda/4$, in other words, a film thickness of $\lambda/4n$ (where $\lambda$: oscillation (or emission) wavelength; n: reflective index).

LISTING OF REFERENCES

Patent Literature

Patent Literature 1: Japanese Patent Publication No. 2971435 B

Non-Patent Literature

Non-Patent Literature 1: "Applied Optics", Hiroshi Kubota, Iwanami Zensho, 1959, P. 92

SUMMARY OF THE INVENTION

Problems to be Solved by the Invention

However, the above mentioned conventional semiconductor laser element inevitably entails a problem that a reflection ratio of the reflective film coating the end face of the semiconductor laser element has a considerably large wavelength dependency. In other words, in the above mentioned conventional semiconductor laser element, the reflection ratio of the reflective film coating the end face thereof considerably varies depending on the wavelength.

An oscillation (emission) wavelength of the semiconductor laser element varies as the temperature changes. For this reason, when the reflection ratio has a large wavelength dependency, then the reflection ratio corresponding to the oscillation wavelength also varies due to the temperature change. This undesired change in the reflection ratio adversely affects a characteristics of the semiconductor laser element such as an optical output, a slope efficiency, a threshold current, a monitoring current or the like so that a desired performance is no more obtainable.

To cope with the above mentioned problem, it is required to control the reflection ratio of the reflective film coating the end face, which corresponds to the oscillation wavelength, to be a designed value with a higher accuracy irrespective of the temperature change. Also, it is required to suppress the wavelength dependency of the reflection ratio of the reflective film coating the end face.

The present invention has been made in view of the above mentioned circumstances and an object thereof is to provide a semiconductor laser element and a semiconductor laser device that are capable of suppressing the wavelength dependency of the reflection ratio of the reflective film coating the end face of the semiconductor laser.

Solution to the Problem

In order to solve the above mentioned problems, according to one aspect of the present embodiments of the present invention, there is provided a semiconductor laser element. The semiconductor laser element comprises: a substrate; semiconductor layers being multi-layered, formed on the substrate and configured to include at least an active layer; and a reflective film constituted with the substrate and the semiconductor layers and provided on at least one of end faces of a resonator.

The reflective film includes: an $L_1$ layer arranged at a first position counting from the one of the end faces of the resonator and having a refractive index of n1; and a periodic structure configured by layering, on the $L_1$ layer, a plurality of pairs of an $L_{2N}$ layer and an $L_{2N+1}$ layer. The $L_{2N}$ layer is arranged at a $2N^{-th}$ position (where N is a positive integer) counting from the one of the end faces of the resonator and has a refractive index of n2, and the $L_{2N+1}$ layer is arranged at a $2N+1^{-th}$ position (where N is a positive integer) counting from the one of the end faces of the resonator and has a refractive index of n3, where n2<n3.

The $L_1$ layer has a linear expansion coefficient within ±30% with respect to a linear expansion coefficient of the substrate and is made of a film having an optical film thickness thinner than $\lambda/4$. An $L_2$ layer arranged at a second position counting from the one of the end faces of the resonator is made of a film having an optical film thickness thinner than $\lambda/4$.

A material for the semiconductor laser may be a compound semiconductor including, for example, a GaAs/AlGaAs based, an InP/InGaAsP based, an InGaP/InGaAlP based, or a GaN/AlGaN based compound semiconductor or the like. In many cases, a crystal substrate such as GaAs, InP, a sapphire ($Al_2O_3$), or GaN or the like may be used.

For this reason, the $L_1$ layer is constituted with a material that has a linear expansion coefficient close to a linear expansion coefficient of such a crystal substrate. With the $L_1$ layer being so configured, it makes it possible to suppress the reflective film from exfoliating from the end face of the resonator and also to suppress the stress from being applied to the crystal substrate so as to improve the reliability of the semiconductor laser element.

As described above, by selecting the material of the $L_1$ layer as appropriate, it makes it possible to improve the adhesiveness of the $L_1$ layer with the end face of the resonator. Also, by making the optical film thicknesses of the $L_1$ layer and the $L_2$ layer thinner than $\lambda/4$, respectively, it makes it possible to attain both of preventing the reflective film from exfoliating and suppressing the wavelength dependency of the reflection ratio of the reflective film simultaneously. As a result, it makes it possible to suppress the characteristic of the semiconductor laser element, such as the optical output, the slope efficiency, the threshold current, the monitoring current or the like, from being lowered.

Furthermore, in the above mentioned semiconductor laser element, a sum of the optical film thickness of the $L_1$ layer and the optical film thickness of an $L_2$ layer, which is arranged at a second position counting from the end face of the resonator, may be approximately $\lambda/4$ (that is, $\lambda/4$ or substantially $\lambda/4$). With the sum of the optical thicknesses being so defined, it makes it possible to further suppress the wavelength dependency of the reflection ratio of the reflective film in more appropriate manner.

Yet furthermore, the above mentioned semiconductor laser element may further comprise an uppermost layer that is arranged on the periodic structure and has a refractive index of n4, where $n2 \leq n4 < n3$. In this case, a low refractive index film of the uppermost layer annihilates a curve of the reflection ratio spectrum that tends to be convex upwardly. Thus, it makes it possible to allow a peak of the curve of the reflection ratio spectrum to be close to be flat. As a result, it makes it possible to suppress the wavelength dependency of the reflection ratio of the reflective film in an appropriate manner.

Yet furthermore, in the above mentioned semiconductor laser element, the film thickness of the $L_1$ layer may be equal to or greater than 10 nm and equal to or less than 90 nm. Preferably, the film thickness of the $L_1$ layer may be equal to or greater than 10 nm and equal to or less than 30 nm. In this way, by constituting the $L_1$ layer to be thinner as far as possible, it makes it possible to allow the difference in the refractive indices, which is between the refractive index of a combination of the $L_1$ layer and $L_2$ layer and the refractive index of the $L_3$ layer, to be larger. As a result, it makes it possible to attain both of suppressing the wavelength dependency of the reflection ratio of the reflective film and achieving the higher reflection ratio simultaneously.

Yet furthermore, in the above mentioned semiconductor laser element, the refractive index of the $L_1$ layer may be within a range between 1.5 and 1.8. For example, the $L_1$ layer may be made of aluminum ($Al_2O_3$).

A semiconductor laser material may be a compound semiconductor including, for example, a GaAs/AlGaAs based, an InP/InGaAsP based, an InGaP/InGaAlP base, or a GaN/AlGaN based compound semiconductor or the like. In many cases, a crystal substrate such as GaAs, InP, a sapphire ($Al_2O_3$), or GaN or the like may be used. For this reason, the $L_1$ layer is constituted with $Al_2O_3$ that has a linear expansion coefficient close to a linear expansion coefficient of such a crystal substrate. With the $L_1$ layer being so configured, it makes it possible to suppress the reflective film from exfoliating from the end face of the resonator and also to suppress the stress from being applied to the crystal substrate so as to improve the reliability of the semiconductor laser element.

Yet furthermore, in the above mentioned semiconductor laser element, the refractive index of the $L_{2N}$ layer may be within a range between 1.4 and 3.5. In addition, in the above mentioned semiconductor laser element, the refractive index of the $L_{2N+1}$ layer may be within a range between 1.5 and 4.0.

A material of the $L_{2N}$ layer and the $L_{2N+1}$ layer may be selected from a group consisting of, for example, silicon dioxide ($SiO_2$), silicon nitride ($SiN_x$), zirconium oxide ($ZrO_x$), titanium oxide ($TiO_x$), and amorphous silicon ($\alpha$-Si) and the like in order to sufficiently assure the difference in the refractive indices between the $L_{2N}$ layer and the $L_{2N+1}$ layer. As a result, it makes it possible to enlarge an increase in the refractive index per a pair of the $L_{2N}$ layer and the $L_{2N+1}$ layer.

Yet furthermore, in the above mentioned semiconductor laser element, the refractive index n1 of the $L_1$ layer and the refractive index n2 of the $L_2$ layer may satisfy a relationship expressed by n1>n2. In this case, the difference in the refractive indices between the refractive index n2 of the $L_2$ layer, which is arranged at a second position counting from the end face of the resonator, and the refractive index n3 of the $L_3$ layer, which is arranged at a third position counting from the end face of the resonator, may be larger than the difference in the refractive indices between the refractive index n1 of the $L_1$ layer and the refractive index n3 of the $L_3$ layer. As a result, it makes it possible to contribute or attain the higher refractive index of the reflective film of the semiconductor laser element.

Yet furthermore, in the above mentioned semiconductor laser element, a refractive index of the uppermost layer may be within a range between 1.4 and 3.5. For example, the uppermost layer may be constituted with alumina ($Al_2O_3$). With the uppermost laser being so configured, it makes it possible to allow the reflection ratio of the reflective film to be a designed value in an appropriate manner.

Also, by constituting the uppermost layer with a same substance as the $L_{2N}$ layer which constitutes the periodic structure, it makes it possible to reduce an associated cost for manufacturing the reflective film.

Yet also, in the above mentioned semiconductor laser element, the reflection ratio of the reflective film may be equal to or greater than 40%. By doing this, it makes it possible to attain a semiconductor laser element in which the highly reflective film is formed on the end face of the resonator thereof.

Yet furthermore, according to another aspect of the present embodiments of the present invention, there is provided a semiconductor laser element. The semiconductor laser element comprises: a substrate; semiconductor layers that is multi-layered, formed on the substrate, and includes at least an active layer; and a reflective film provided on at least one of end faces of a resonator constituted with the substrate and the semiconductor layers. The reflective film may be a multi-layered reflective film having an amount of change in a reflection ratio within 0.10% within a range of ±10 nm from a center wavelength. In this case, the center wavelength may be a wavelength at a local maximum (maximal) point or a local minimum (minimal) point of the reflection ratio spectrum.

As described above, by suppressing the wavelength dependency of the reflection ratio of the reflective film, it makes it possible to suppress the characteristics of the semiconductor laser element, such as an optical output, a slope efficiency, a threshold current, a monitoring current or the like, from being lowered.

Yet furthermore, according to another aspect of the present embodiments of the present invention, there is provided a semiconductor laser device. The semiconductor laser device comprises: the semiconductor laser element according to any one of the above mentioned semiconductor laser elements; and alight receiving unit (light receiving element) configured to receive laser light emitted from the end face of the resonator via the reflective film. The light receiving unit (light receiving element) is provided for a controller to convert the laser light received by the light receiving unit into a current, and to control a current amount to be supplied to the semiconductor laser element based on a value of the current converted.

By doing this, it makes it possible to attain the semiconductor laser device that has a higher reliability and a higher accuracy of controlling an optical output and a supply current.

Advantageous Effect of the Invention

According to the above mentioned aspects of the semiconductor laser element of the various embodiments, it makes it possible to suppress the wavelength dependency of the reflection ratio of the reflective film coating the end face of the resonator of the semiconductor laser element. As a result, it makes it possible to suppress the characteristics of the semiconductor laser element, such as the optical output, the slope efficiency, the threshold current, the monitoring current or the like, from being lowered.

These and other objects, aspects and advantages of the present invention will become apparent to those skilled in the art from the following detailed description when read and understood in conjunction with the appended claims and drawings.

BRIEF DESCRIPTION OF THE DRAWINGS

FIG. 4 is a view illustrating an exemplary configuration of a reflective film according to a first working example of the semiconductor laser element;

FIG. 6 is a view illustrating an exemplary configuration of a reflective film according to a second working example of the semiconductor laser element;

FIG. 8 is a view illustrating an exemplary configuration of a reflective film according to a third working example of the semiconductor laser element;

FIG. 10 is a view illustrating an exemplary configuration of a reflective film according to a fourth working example of the semiconductor laser element;

FIG. 12 is a view illustrating an exemplary configuration of a reflective film according to a fifth working example of the semiconductor laser element;

FIG. 14 is a view illustrating an exemplary configuration of a reflective film according to a first comparative example of the semiconductor laser element;

FIG. 16 is a view illustrating an exemplary configuration of a reflective film according to a second comparative example of the semiconductor laser element;

FIG. 18 is a view illustrating an exemplary configuration of a reflective film according to a sixth working example of the semiconductor laser element;

FIG. 20 is a view illustrating an exemplary configuration of a reflective film according to a seventh working example of the semiconductor laser element;

FIG. 22 is a view illustrating an exemplary configuration of a reflective film according to a third comparative example of the semiconductor laser element.

DETAILED DESCRIPTION OF THE INVENTION

Hereinafter, embodiments of the semiconductor laser element according to the present invention will be explained in detail with reference to accompanying drawings.

In the following embodiments, a certain case will be exemplarily described in which a red laser having an oscillation wavelength of a semiconductor laser element from 600 nm to 700 nm waveband is employed.

First Embodiment

Figure 1:
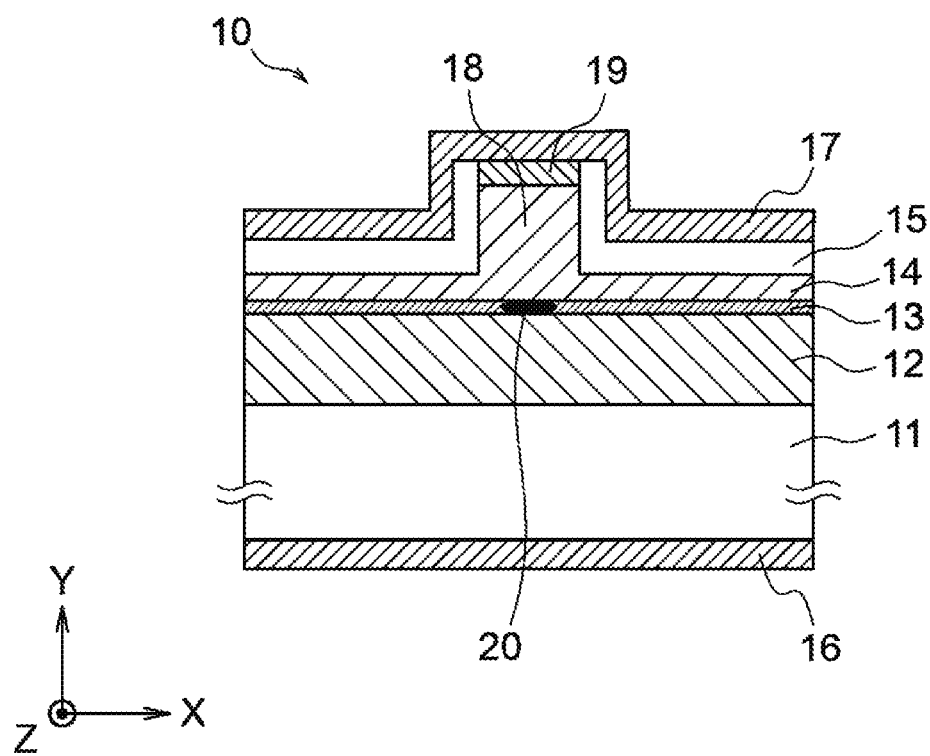
FIG. 1 is a cross sectional view illustrating an exemplary configuration of a semiconductor laser element according to a present embodiment of the present invention.

FIG. 1 is a cross sectional view illustrating an exemplary configuration of a semiconductor laser element 10 according to a present embodiment.

The semiconductor laser element 10 is assembled into a semiconductor laser device, and emits laser light when a predetermined injected current is fed to the semiconductor laser element 10.

The semiconductor laser element 10 is provided with a substrate 11. For example, the substrate 11 may be a crystal substrate made of gallium arsenide (GaAs), indium phosphorus (InP), sapphire (Al2O3), gallium nitride (GaN) or the like.

The semiconductor laser element 10 is provided with semiconductor layers, which is multi-layered, on the substrate 11. The semiconductor layers have a configuration, on the substrate 11, in which at least a first conductive type semiconductor layer 12, an active layer 13, and a second conductive type semiconductor layer 14 are layered in turn in this order. According to the present embodiment, it is assumed that an n-type cladding layer, which serves as the first conductive type semiconductor layer 12, (for example, n-InGaAlP) is formed at a lower portion in FIG. 1, and a p-type cladding layer, which serves as the second conductive type semiconductor layer 14, (for example, p-InGaAlP) is formed at an upper portion in FIG. 1, with the n-type cladding layer and the p-type cladding layer facing each other across the active layer 13.

The active layer 13 is made of a Multi-Quantum-Well (MQW) structure or alternatively a Single-Quantum-Well (SQW) structure using, for example, InGaP, InGaAlP or the like. A material or a compositional ratio or the like of the active layer 13 may be selected as appropriate depending on a light emission wavelength of the semiconductor laser element 10.

Furthermore, the semiconductor laser element 10 is provided with a first electrode (n-electrode) 16, which is formed on an opposite surface of the substrate 11 to a surface thereof on which the above mentioned semiconductor layer is formed, and a second electrode (P-electrode) 17, which is formed on the semiconductor layers (an upper side of the semiconductor layers in FIG. 1) via an insulating layer 15.

Yet furthermore, at the second electrode 17 side of the semiconductor laser element 10, more particularly, at the p-type cladding layer 14, a ridge portion 18 on which a ridge (protruding portion) is formed is provided. In the insulating layer 15, an opening is provided at a top portion of the ridge portion 18. Then, in the opening of the insulating layer 15 at the top portion of the ridge portion 18, a p-type contact layer 19, which serves as a second conductive type contact layer, is formed.

It should be noted that the ridge portion 18 serves as a current constricting portion configured to intensively inject the current to a particular region of the active layer 13, which serves as the light emitting portion. In other words, in FIG. 1, a region 20 in the active layer 13 corresponding to the ridge portion 18 serves as a luminous point, and this luminous point 20 emits laser light in a direction vertical to a paper surface in FIG. 1.

Figure 2:
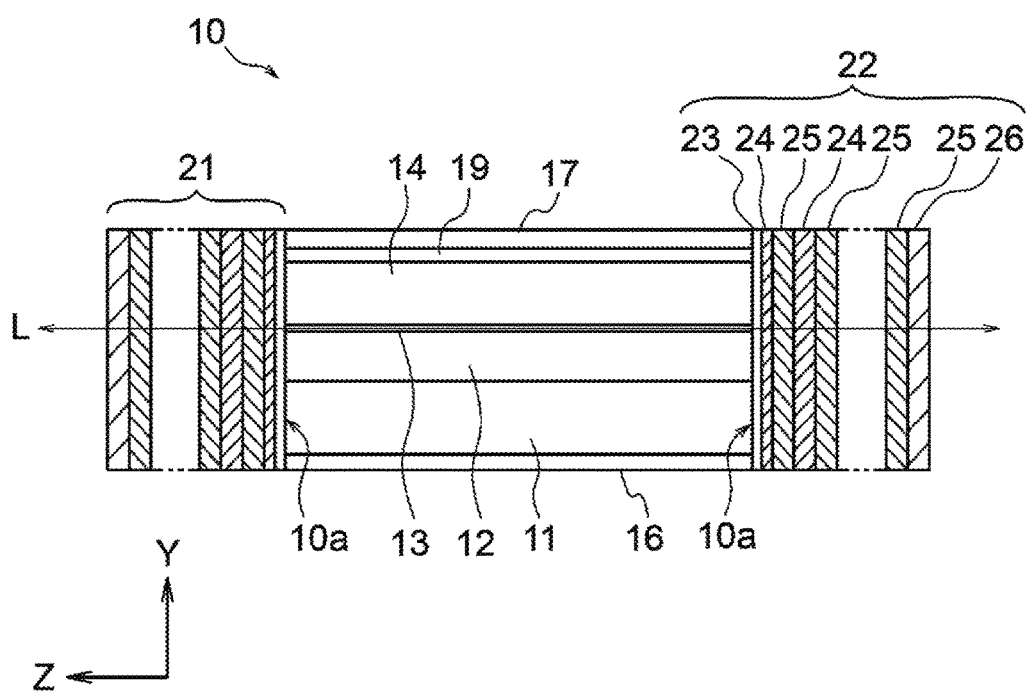
FIG. 2 is a view illustrating an exemplary configuration of a coating film (reflective film) according to the present embodiment.

As shown in FIG. 2, the semiconductor laser element 10 is capable of emitting laser light L from both end faces (end faces of a resonator) 10a. As shown in FIG. 2, the semiconductor laser element 10 is provided with a coating film (reflective film) 21 formed on one of the end faces 10a of the resonator, and a reflective film 22 formed on the other of the end faces 10a of the resonator. The reflective films 21 and 22 are films that are formed by layering layers having different refractive indexes from one another, respectively.

According to the present embodiment, it is assumed that the semiconductor laser element 10 emits the laser light L mainly from a front side (the left direction in FIG. 2). Also, it is assumed that the reflective film 22 is, for example, a multi-layered reflective film having a reflection ratio equal to or greater than 40%. It should be noted that the reflective films 21 and 22 have similar configuration to each other except that conditions defining the reflection ratio, such as the number of layers, a film material, and a film thickness and the like, may be different from each other. Thus, hereinafter, a configuration of the reflective film 22 will be representatively described.

The reflective film 22 has a configuration in which an $L_1$ layer, an $L_2$ layer, an $L_3$ layer, . . . are in turn layered from one of the end faces 10a of the resonator. More particularly, the $L_1$ layer (that is, a lowermost layer), which contacts the end face, is a first low refractive index film having a refractive index of n1, and has a linear expansion coefficient within ±30% with respect to a linear expansion coefficient of the substrate 11.

Also, the $L_2$ layer is a second low refractive index film having a refractive index of n2, and the $L_3$ layer is a high refractive index film having a refractive index of n3. Subsequently, at or after the $L_4$ layer, the second low refractive index films 24 and the high refractive index films 25 are alternately layered over a plurality of cycles. In other words, at or after the $L_2$ layer, a periodic structure is constituted in which a plurality of pairs of the second low refractive index film 24 and the high refractive index film 25 are layered.

In addition, at an uppermost layer, a third low refractive index film 26 having a refractive index n4 is arranged. Here, the magnitude relationship is n1<n3, n2<n3, and n2≤n4<n3. Also, the relationship may be n1>n2. For example, the refractive index n1 of the $L_1$ layer may be within a range between 1.5 and 1.8, the refractive index n2 of the $L_{2N}$ layer may be within a range between 1.4 and 3.5, the refractive index n3 of the $L_{2N+1}$ layer may be within a range between 1.5 and 4.0, and the refractive index n4 of the uppermost layer may be within a range between 1.4 and 3.5.

It should be noted that the second low refractive index films 24, which constitute the periodic structure, (the $L_2$ layer, the $L_4$ layer, the $L_6$ layer, . . . ) are not necessarily required to be the identical materials to one another. Likewise, the high refractive index films 25, which constitute the periodic structure, (the $L_3$ layer, the $L_5$ layer, the $L_7$ layer, . . . ) are not necessarily required to be the identical materials to one another.

A material of the first low refractive index film 23, which serves as the $L_1$ layer, is selected from those materials having the linear expansion coefficient from $3.9 \times 10^{-6}$ (1/K) to $8.4 \times 10^{-6}$ (1/K), and is, for example, alumina ($Al_2O_3$; the linear expansion coefficient from $6 \times 10^{-6}$ to $8 \times 10^{-6}$ (1/K); the refractive index from 1.5 to 1.8) or the like. A material of the second low refractive index film 24 is, for example, silicon dioxide ($SiO_2$; the refractive index from 1.4 to 1.6) or $Al_2O_3$ or the like. It should be noted that, amongst those films, the second low refractive index film 24, which serves as the $L_2$ layer, is constituted with a different material from the $L_1$ layer.

Also, a material of the high refractive index film 25, which serves as the $L_3$ layer, is, for example, silicon nitride ($SiN_x$; the refractive index from 1.7 to 2.3), amorphous silicon (α-Si; the refractive index from 2.0 to 4.0), titanium oxide ($TiO_x$; the refractive index from 2.0 to 3.0), zirconium oxide ($ZrO_x$; the refractive index from 1.8 to 2.2) or the like.

The material of the third low refractive index film 26, which serves as the uppermost layer, is, for example, $Al_2O_3$ or $SiO_2$ or the like. The material of the third low refractive index film 26 may be the same as the material of the first low refractive index film 23 or the material of the second low refractive index film 24, or alternatively, different from those of the first low refractive index film 23 or the second low refractive index film 24.

The above mentioned refractive index value is assumed to be a value at the oscillation wavelength of 633 nm of He—Ne laser, which is commonly used as the standard for the wavelength.

It should be noted that the material of the film constituting respective layers may be selected as appropriate depending on the material of the substrate 11, the oscillation wavelength, and the number of layers and the like of the semiconductor laser element 10. Also, the number of the layers constituting the reflective film 22 are not limited and can be determined as appropriate depending on the designed value or the like of the reflective film 22 in question. Yet furthermore, a deposition apparatus configured to form the films constituting the respective layers are not limited, and, for example, a magnetron, or an ECR sputter apparatus or the like may be used.

An optical film thickness of the first low refractive index film 23, which serves as the $L_1$ layer, and an optical film thickness of the second low refractive index film 24, which serves as the $L_2$ layer, are set to be thinner than $\lambda/4$, respectively (here, $\lambda$ is an oscillation wavelength of the semiconductor laser element 10).

For example, it is possible to set a sum of the optical film thickness of the first low refractive index film 23, which serves as the $L_1$ layer, and the optical film thickness of the second low refractive index film 24, which serves as the $L_2$ layer, to be approximately $\lambda/4$ [nm], where "approximately $\lambda/4$" means $\lambda/4$ or substantially $\lambda/4$, and more particularly, it means within ±10% with respect to $\lambda/4$.

It should be noted that the film thickness of the first low refractive index film 23 ($Al_2O_3$) which serves as the $L_1$ layer, is set to be equal to or greater than 10 nm and equal to or less than 90 nm. It is preferable to set the film thickness of the first low refractive index film 23 ($Al_2O_3$) to be equal to or greater than 10 nm and equal to or less than 30 nm (for example, 30 nm). The film thickness of the $L_1$ layer may be set as appropriate depending on the designed value of the reflective film 22 or the like.

Yet furthermore, the optical film thicknesses of the second low refractive index film 24 except for the $L_2$ layer, the high refractive index film 25, and the third low refractive index film 26 of the uppermost layer are set to be $\lambda/4$, respectively.

As described above, the semiconductor laser element 10 according to the present embodiment is provided with the reflective film 22 on at least one of end faces of the resonator.

The reflective film 22 is provided with the first low refractive index film 23 (with the refractive index n1) in which the linear expansion coefficient and the optical film thickness thereof satisfy the above described ranges, respectively, as the $L_1$ layer formed with the $L_1$ layer contacting the end face 10a of the resonator.

Furthermore, the reflective film 22 is provided with the periodic structure, on an upper face of the $L_1$ layer, in which a plurality of pairs of the second low refractive index film 24 (with the refractive index n2), which serves as the $L_{2N}$ layer (where N is a positive integer), and the high refractive index film 25 (with the refractive index n3), which serves as the $L_{2N+1}$ layer (where N is a positive integer) are layered.

Yet furthermore, the reflective film 22 is provided with the third low refractive index film 26 (with the refractive index n4) as the uppermost layer on the periodic structure.

With the above mentioned configuration, it makes it possible to reduce or diminish the wavelength dependency of the reflection ratio of the reflective film 22. In other words, it makes it possible to make a peak of the reflection ratio curve (that is, the curve of the reflection ratio spectrum) be more flat, where a vertical axis denotes the reflection ratio and a horizontal axis denotes the wavelength.

More particularly, according to the present embodiment, a variance (change amount) of the reflection ratio (that is, maximum value−minimum value) is equal to or less than 0.10% in the range within ±10 nm from the center wavelength (that is, the local maximum (maximal) point or the local minimum (minimal) point of the reflection ratio spectrum).

Figure 3:
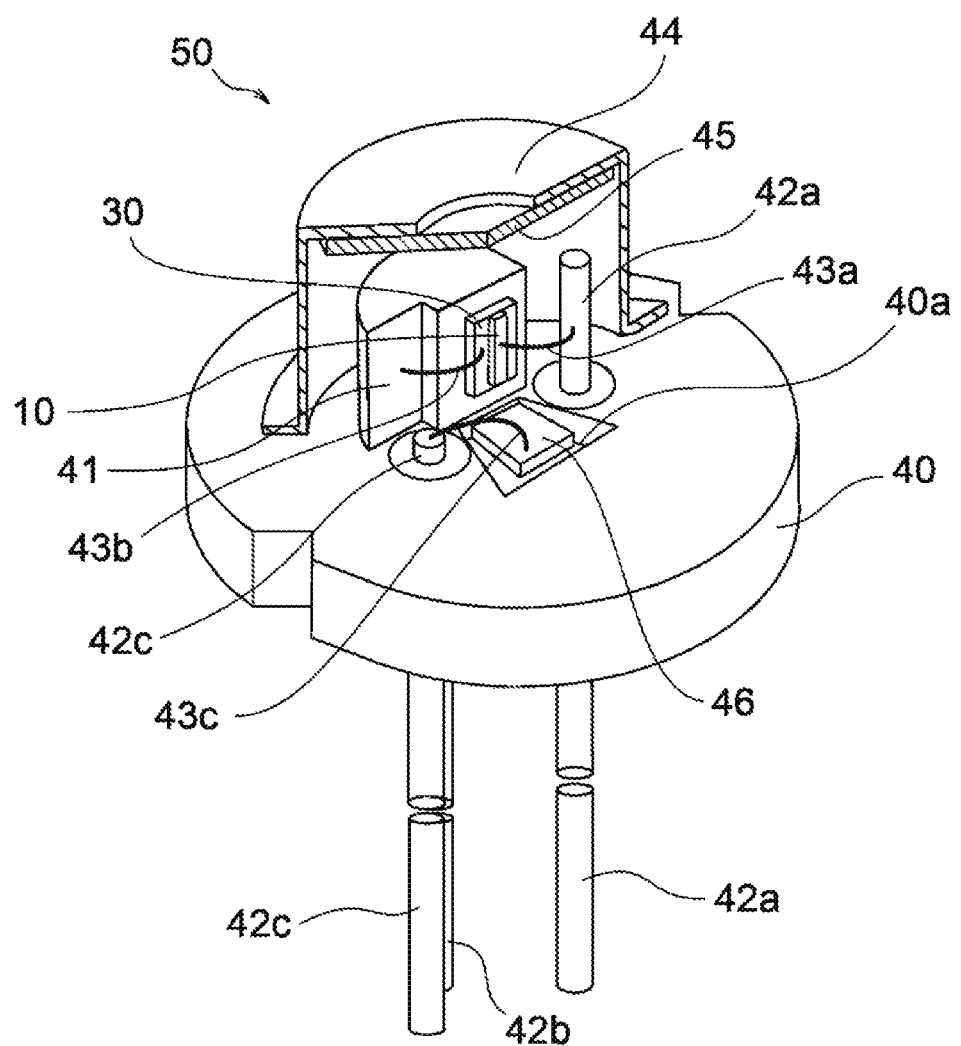
FIG. 3 is a view showing an exemplary configuration of a semiconductor laser device according to the present embodiment.

Hereinafter, referring to FIG. 3, a semiconductor laser device into which the above mentioned semiconductor laser element 10 is implemented and a method for manufacturing thereof will be described in detail.

When manufacturing a semiconductor laser device 50, first, the semiconductor laser element 10 is joined to a sub-mount 30. A main body portion of the sub-mount 30 is made of, for example, aluminum nitride (AlN).

It should be noted that a material of the main body portion of the sub-mount 30 may be selected as appropriate with factors being taken into consideration such as the heat radiation property, the insulation property, difference in the linear expansion coefficients from the semiconductor laser element 10, and an associated cost and the like. For example, the insulating material having a higher heat radiation property may include silicon carbide (SiC), and diamond and the like. The conductive material may include Cu, CuW, and CuMo and the like. Also, relatively inexpensive material may include Si, aluminum oxide ($Al_2O_3$) and the like. Yet furthermore, the main body portion of the sub-mount 30 may be constituted with a multi-layered structure in which the insulating material such as SiC or the like and the conductive material such as Cu or the like are combined together.

On the surface of the sub-mount 30, an electrode wiring, which is not shown in the drawings, is formed with, for example, gold (Au) or the like. The semiconductor laser element 10 is joined on the electrode wiring via, for example, a gold-tin (AuSn) solder. The joining method may be the junction-down method, or alternatively, the junction-up method. It allows the surface electrode of the semiconductor laser element 10 (a first electrode or a second electrode) to be electrically conductive with the electrode wiring of the sub-mount 30. It should be noted that a joining material of the surface of the sub-mount 30 may be a solder material such as tin-silver-copper (SnAgCu), tin-silver (SnAg), tin-gold (SnAu) or the like, or alternatively, a low melting point metal material such as indium (In), or a silver (Ag) paste.

After the semiconductor laser element 10 is joined to the sub-mount 30, the semiconductor laser element 10 is, together with the sub-mount 30, joined to a stem 40 in a disk shape that constitutes the semiconductor laser device 50. The stem 40 has a heat sink portion 41 in the vicinity of a center portion thereof. The sub-mount 30 to which the semiconductor laser element 10 is joined is joined to the heat sink portion 41 via the solder. At this moment, the sub-mount 30 is joined to the heat sink portion 41 such that the light emitting direction of the laser light emitted from the semiconductor laser device 10 coincides with a vertical direction with respect to a disk-shaped surface of the stem 40.

It should be noted that, in the above description, a certain case has been described in which the sub-mount 30 to which the semiconductor laser element 10 is already joined is subsequently joined to the stem 40 after the semiconductor laser element 10 is joined to the sub-mount 30. Nevertheless, a manufacturing process for the semiconductor laser device is not limited to those described above. For example, the semiconductor laser element 10 may be mounted on the sub-mount 30 to join the semiconductor laser element 10 to the sub-mount 30, after the sub-mount 30 is joined to the stem 40. Furthermore, alternatively, the sub-mount 30 may be joined to the stem 40 simultaneously with the sub-mount 30 being joined to the semiconductor laser element 10 in a single process.

The stem 40 may be constituted with, for example, a Fe alloy. The stem 40 may be, for example, gold-plated iron (Fe) or a gold-plated copper (Cu). The heat sink portion 41 may be constituted with metal having a higher heat conductivity such as copper (Cu) or the like. Also, leads 42a to 42c are fixed to the stem 40, respectively. The leads 42a and 42c penetrate the stem 40 and are electrically insulated from the stem 40, respectively. On the other hand, the lead 42b is fixed to a bottom face of the stem 40 and is kept to be electrically equipotential to the stem 40.

The lead 42a is electrically joined (with the wire bonding) to one of surface electrodes of the semiconductor laser element 10 (that is, an electrode at a side not connected to the sub-mount 30) via an Au wire 43a. Also, the lead 42b is electrically joined to the other of the surface electrodes of the semiconductor laser element 10 (that is, an electrode at a side connected to the sub-mount 30) via the stem 40, which is kept in the equipotential thereto, the Au wire 43b, and the heat sink portion 41.

In addition, in a part of disk-shaped surface of the stem 40, an inclined surface 40a is provided. On the inclined surface 40a, a photo diode 46 configured to monitor an optical output from the laser is arranged. The lead 42c is electrically joined to a surface electrode of the photo diode 46 via the Au wire 43c. It should be noted that a back surface electrode of the photo diode 46 is joined to the stem 40 with the silver (Ag) paste or the like, and electrically connected to the lead 42b via the stem 40.

The photo diode 46 is a light receiving element (that is, a light receiving portion) that receives light emitted from a rear side of the semiconductor laser element 10 (lower side in FIG. 3) and converts the received light to current. By monitoring a current value outputted from the photo diode 46, it makes it possible to control an amount of light emitted from the semiconductor laser element 10.

Ultimately, a cap 44 having a cylindrical shape is mounted on the disk-shaped surface of the stem 40 so as to air-tightly seal the semiconductor laser element 10 and associated components by the welding or the like. As a result, the cap 44 covers or encloses the all components of the heat sink portion 41 of the stem 40, the leads 42a and 42c, the sub-mount 30, the semiconductor laser element 10, the photo diode 46, and the Au wires 43a to 43c. The cap 44 may be made of, for example, metal, and mounted to the stem 40 in an aim of protecting the above mentioned semiconductor laser element 10, and the Au wires 43a to 43c and the like. At a center portion of an upper face of the cap 44, a light extracting window 45 is formed that allows the laser light emitted from the semiconductor laser element 10 to transmit.

By performing the above mentioned processes, the semiconductor laser device 50 is manufactured. In the semiconductor laser device 50, when a predetermined voltage is applied between the lead 42a and the lead 42b, an electric power is fed to the semiconductor laser element 10 so as to allow the laser light to be emitted from the end face of the semiconductor laser element 10. At this moment, the laser light emitted from a front side of the semiconductor laser element 10 (an upper side in FIG. 3) transmits or passes through the light extracting window 45 and radiates outside the stem 40.

On the other hand, the laser light emitted from a back side of the semiconductor laser element 10 is incident to the photo diode 46. By applying a reverse bias between the lead 42b and the lead 42c, the current flows in the photo diode 46 when receiving the light, and the photo diode 46 outputs a light receiving signal.

WORKING EXAMPLES

Hereinafter, working examples that have been performed in order to confirm an advantageous effects of the present embodiments will be described in detail below.

A reflective film having the following specifications was formed on the end face or faces of the resonator, and the wavelength dependency of the reflection ratio of the reflective film was evaluated.

In the following working examples, a substrate of the semiconductor laser element was made of GaAs, an active layer was made of InGaP, and a cladding layer was made of InGaAlP, respectively. It should be noted that the linear expansion coefficient of the substrate of GaAs is approximately $6.4 \times 10^{-6}$ (1/K), and the linear expansion coefficient of alumina ($Al_2O_3$) is from $6 \times 10^{-6}$ to $8 \times 10^{-6}$ (1/K).

As a prerequisite, an oscillation wavelength λ of the semiconductor laser is assumed to be 670 (nm) at 25 degrees Celsius. In order to cope with this prerequisite, a center wavelength of the reflection ratio spectrum, in other words, a local maximum point of a graph with the horizontal axis denoting the wavelength and the vertical axis denoting the reflection ratio, was designed such that the center wavelength of the local maximum point is to be 670 (nm) (or a local minimum point thereof in the case that the graph has an extremely good flatness and a flat portion thereof has an extremely moderate convex shape downwardly).

Also, the refractive indices n of respective materials were as follows.

Alumina ($Al_2O_3$): 1.67; silicon dioxide ($SiO_2$): 1.50, silicon nitride ($SiN_x$): 2.00; titanium oxide ($TiO_x$): 2.51; amorphous silicon (α-Si): 4.00; and the end face of the semiconductor: 3.28.

Amongst respective layers constituting the reflective films, the $L_1$ layer, which is a lowermost layer and contacts the end face of the resonator, was constituted with a material having the linear expansion coefficient close to the linear expansion coefficient of the substrate of the semiconductor laser element.

Working Example 1

The reflective film was made by ten layers, as shown in FIG. 4. More particularly, the reflective film was constituted in a structure having an lowermost $Al_2O_3$ layer ($L_1$ layer), a periodic structure ($L_2$ layer to $L_9$ layer) in which a low refractive index film ($SiO_2$) and a high refractive index film ($SiN_x$) are alternately layered in four cycles, and an uppermost $Al_2O_3$ layer ($L_{10}$ layer) serving as a low refractive index film.

The film thickness of the $L_1$ layer was set to 30.0 [nm] and the film thickness of the $L_2$ layer was set to 82.0 [nm]. In other words, a sum of the optical film thickness of the $L_1$ layer and the optical film thickness of the $L_2$ layer was set to an approximately λ/4 [nm].

First, the film thickness of the $L_1$ layer was fixed to be 30.0 (nm), and the film thickness of the $L_2$ layer was designed such that the center wavelength of the reflection ratio spectrum was to be 670 (nm). The above described method of designing the $L_1$ layer and the $L_2$ layer are similar to those in the following other working examples.

The film thickness of each of the $L_3$ to $L_{10}$ layers was set to be λ/4n [nm]. It should be noted that n denotes the refractive index of the corresponding layer concerned.

Figure 5:
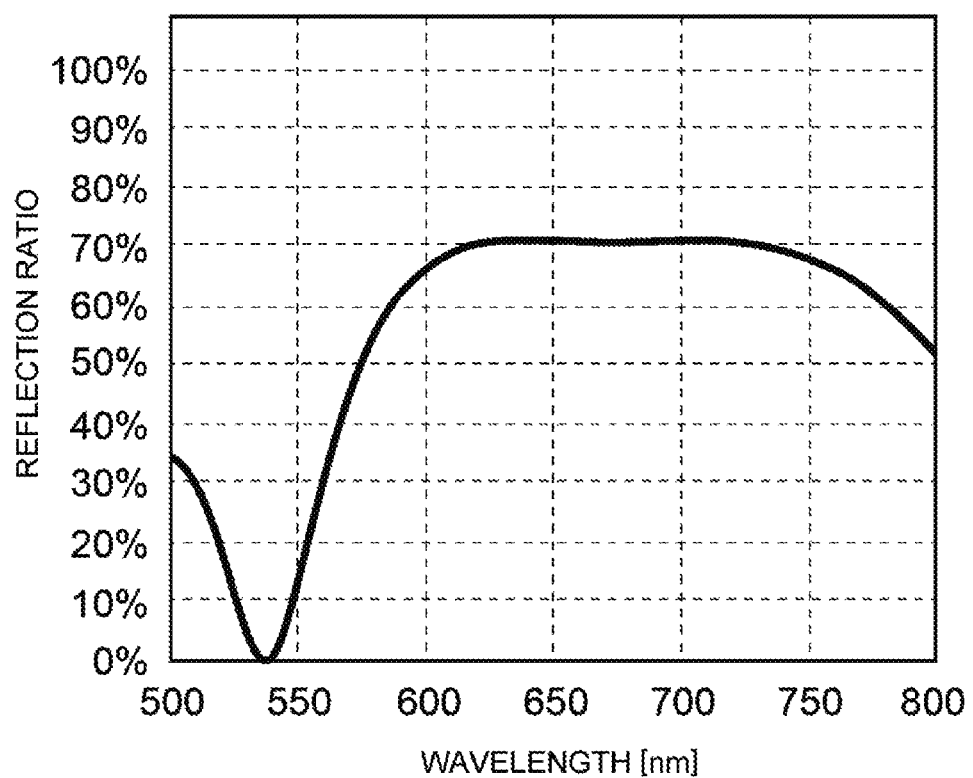
FIG. 5 is a view showing a reflection ratio spectrum according to the first working example of the semiconductor laser element.

FIG. 5 shows a reflection ratio spectrum in the Working Example 1. In FIG. 5, a vertical axis denotes the reflection ratio and a horizontal axis denotes the wavelength. According to the Working Example 1, the reflection ratios with the wavelengths of 660 nm, 670 nm, and 680 nm were 70.206%, 70.136%, and 70.189%, respectively. Also, the difference in the reflection ratios (maximum value−minimum value) within the wavelength range was 0.070%.

Working Example 2

The reflective film was made by twelve layers, as shown in FIG. 6. More particularly, the reflective film was constituted in a structure having a lowermost $Al_2O_3$ layer ($L_1$ layer), a periodic structure ($L_2$ layer to $L_{11}$ layer) in which a low refractive index film ($SiO_2$) and a high refractive index film ($SiN_x$) are alternately layered in five cycles, and an uppermost $Al_2O_3$ layer ($L_{12}$ layer) serving as a low refractive index film. In other words, the Working Example 2 differs from the Working Example 1 in that the Working Example 2 is a structure having a periodic structure greater than those in the Working Example 1 by one more cycle.

Similarly to the Working Example 1, the film thickness of the $L_1$ layer was set to 30.0 [nm] and the film thickness of the $L_2$ layer was set to 84.0 [nm]. In other words, a sum of the optical film thickness of the $L_1$ layer and the optical film thickness of the $L_2$ layer was set to an approximately $\lambda/4$ [nm]. The film thickness of each of the $L_3$ layer to $L_{12}$ layer was set to be $\lambda/4n$ [nm].

Figure 7:
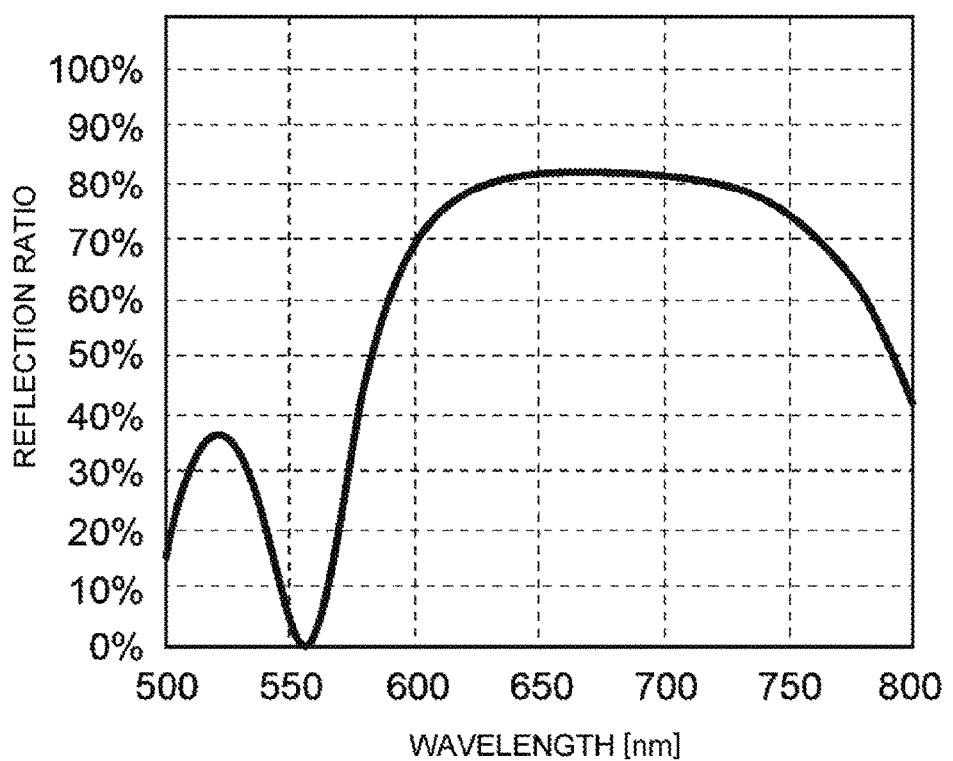
FIG. 7 is a view showing a reflection ratio spectrum according to the second working example of the semiconductor laser element.

FIG. 7 shows a reflection ratio spectrum in the Working Example 2. According to the Working Example 2, the reflection ratios with the wavelengths of 660 nm, 670 nm, and 680 nm were 81.882%, 81.943%, and 81.918%, respectively. Also, the difference in the reflection ratios (maximum value-minimum value) within the wavelength range was 0.060%.

Working Example 3

The reflective film was made by sixteen layers, as shown in FIG. 8. More particularly, the reflective film was constituted in a structure having a lowermost $Al_2O_3$ layer ($L_1$ layer), a periodic structure ($L_2$ layer to $L_{15}$ layer) in which a low refractive index film ($SiO_2$) and a high refractive index film ($TiO_2$) are alternately layered in seven cycles, and an uppermost $Al_2O_3$ layer ($L_{16}$ layer) serving as a low refractive index film. In other words, the Working Example 3 differs from the Working Examples 1 and 2 in that the Working Example 3 is a structure that has a different material and a different number of layers of the high refractive index film from those of the Working Examples 1 and 2.

The film thickness of the $L_1$ layer was set to 30.0 [nm] and the film thickness of the $L_2$ layer was set to 89.0 [nm]. In other words, a sum of the optical film thickness of the $L_1$ layer and the optical film thickness of the $L_2$ layer was set to an approximately $\lambda/4$ [nm]. The film thickness of each of the $L_3$ layer to $L_{16}$ layer was set to be $\lambda/4n$ [nm].

Figure 9:
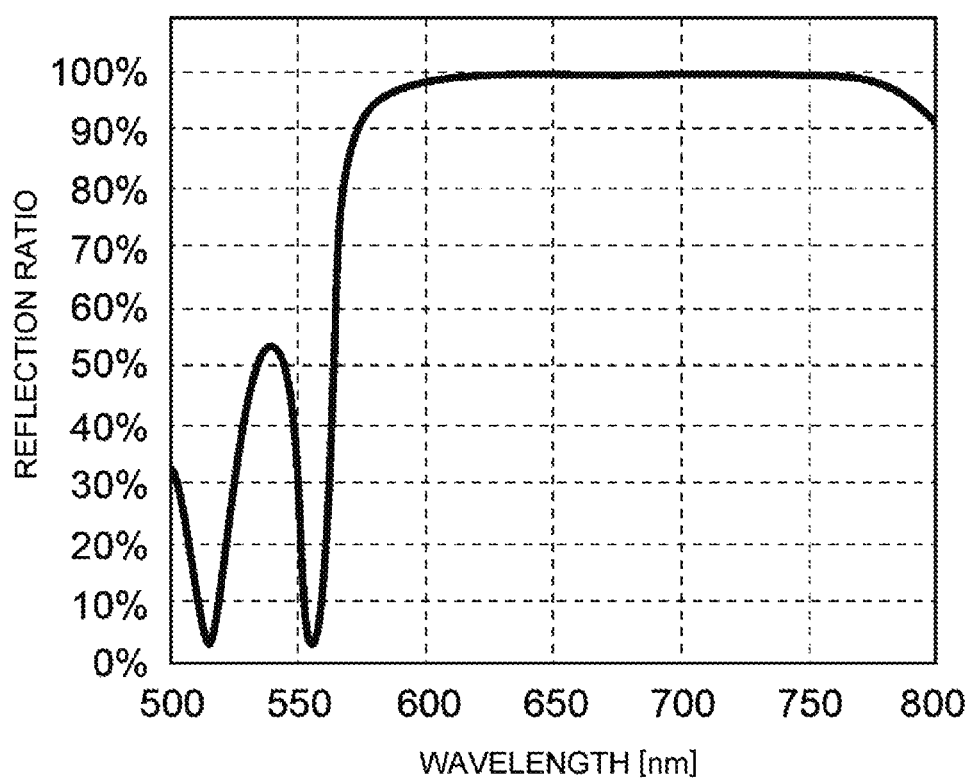
FIG. 9 is a view showing a reflection ratio spectrum according to the third working example of the semiconductor laser element.

FIG. 9 shows a reflection ratio spectrum in the Working Example 3. According to the Working Example 3, the reflection ratios with the wavelengths of 660 nm, 670 nm, and 680 nm were 99.734%, 99.737%, and 99.730%, respectively. Also, the difference in the reflection ratios (maximum value-minimum value) within the wavelength range was 0.007%.

Working Example 4

The reflective film was made of sixteen layers, as shown in FIG. 10. More particularly, the reflective film was constituted in a structure having a lowermost $Al_2O_3$ layer ($L_1$ layer), a periodic structure ($L_2$ layer to $L_{15}$ layer) in which a low refractive index film ($SiO_2$) and a high refractive index film ($TiO_2$) are alternately layered in seven cycles, and an uppermost $SiO_2$ layer ($L_{16}$ layer) serving as a low refractive index film. In other words, the Working Example 4 differs from the Working Example 3 in that the Working Example 4 is a structure that has a different material for the uppermost layer and the same material is used for the low refractive index film serving as the uppermost layer and the low refractive index films constituting the periodic structure.

The film thickness of the $L_1$ layer was set to 30.0 [nm] and the film thickness of the $L_2$ layer was set to 89.0 [nm]. In other words, a sum of the optical film thickness of the $L_1$ layer and the optical film thickness of the $L_2$ layer was set to an approximately $\lambda/4$ [nm]. The film thickness of each of the $L_3$ layer to $L_{16}$ layer was set to be $\lambda/4n$ [nm].

Figure 11:
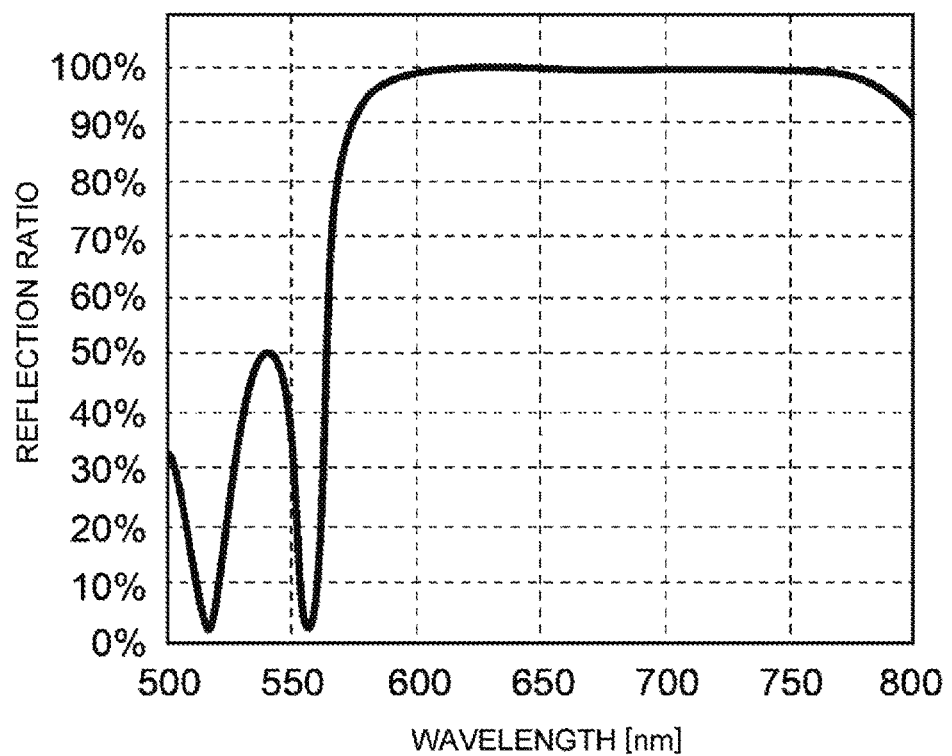
FIG. 11 is a view showing a reflection ratio spectrum according to the fourth working example of the semiconductor laser element.

FIG. 11 shows a reflection ratio spectrum in the Working Example 4. According to the Working Example 4, the reflection ratios with the wavelengths of 660 nm, 670 nm, and 680 nm were 99.785%, 99.788%, and 99.781%, respectively. Also, the difference in the reflection ratios (maximum value-minimum value) within the wavelength range was 0.006%.

Working Example 5

The reflective film was made by six layers, as shown in FIG. 12. More particularly, the reflective film was constituted in a structure having a lowermost $Al_2O_3$ layer ($L_1$ layer), a periodic structure ($L_2$ layer to $L_5$ layer) in which a low refractive index film ($SiO_2$) and a high refractive index film ($TiO_2$) are alternately layered in two cycles, and an uppermost $SiO_2$ layer ($L_6$ layer) serving as a low refractive index film. In other words, the Working Example 5 differs from the Working Example 4 in that the Working Example 5 is a structure that has a different number of layers from those in the Working Example 4.

The film thickness of the $L_1$ layer was set to 50.0 [nm] and the film thickness of the $L_2$ layer was set to 65.0 [nm]. In other words, a sum of the optical film thickness of the $L_1$ layer and the optical film thickness of the $L_2$ layer was set to an approximately $\lambda/4$ [nm]. In this way, the film thicknesses of the $L_1$ layer and the $L_2$ layer were set to be different from those in the Working Example 4, respectively. The film thickness of each of the $L_3$ layer to $L_6$ layer was set to be $\lambda/4n$ [nm].

Figure 13:
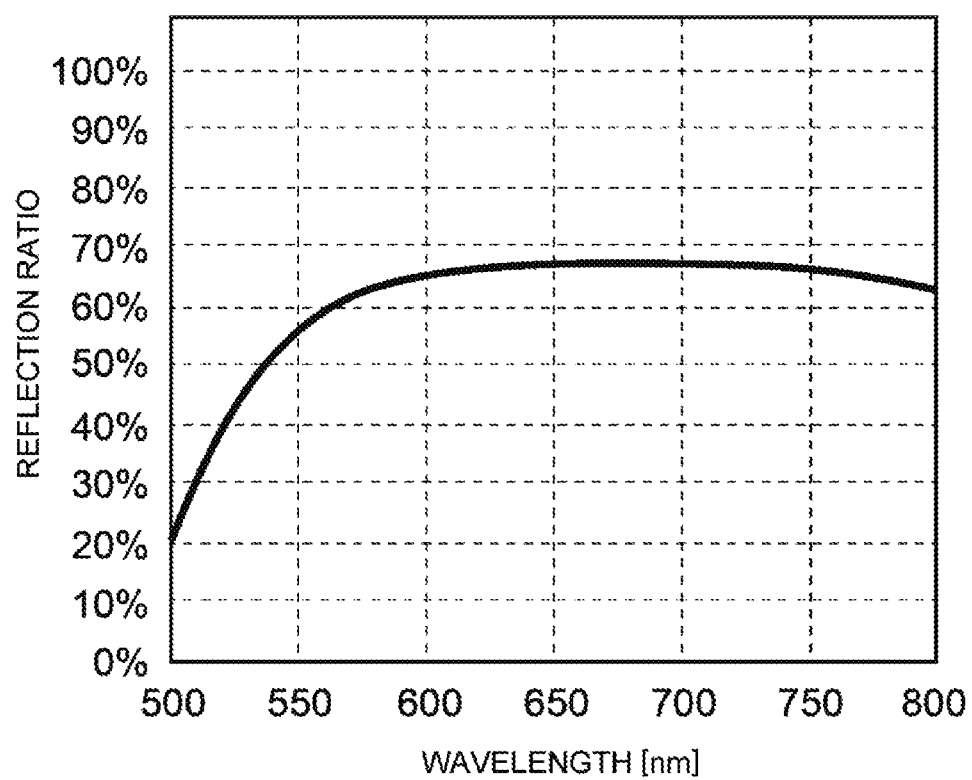
FIG. 13 is a view showing a reflection ratio spectrum according to the fifth working example of the semiconductor laser element.

FIG. 13 shows a reflection ratio spectrum in the Working Example 5. According to the Working Example 5, the reflection ratios with the wavelengths of 660 nm, 670 nm, and 680 nm were 67.879%, 67.892%, and 67.876%, respectively. Also, the difference in the reflection ratios (maximum value-minimum value) within the wavelength range was 0.016%.

Comparative Example 1

The reflective film was made of nine layers, as shown in FIG. 14. More particularly, the reflective film was constituted in a structure having a lowermost $Al_2O_3$ layer ($L_1$ layer), and a periodic structure ($L_2$ layer to $L_9$ layer) in which a high refractive index film ($SiN_x$) and a low refractive index film ($SiO_2$) are alternately layered in four cycles.

The film thickness of each of the $L_1$ layer to $L_9$ layer were set to $\lambda/4n$ [nm].

Figure 15:
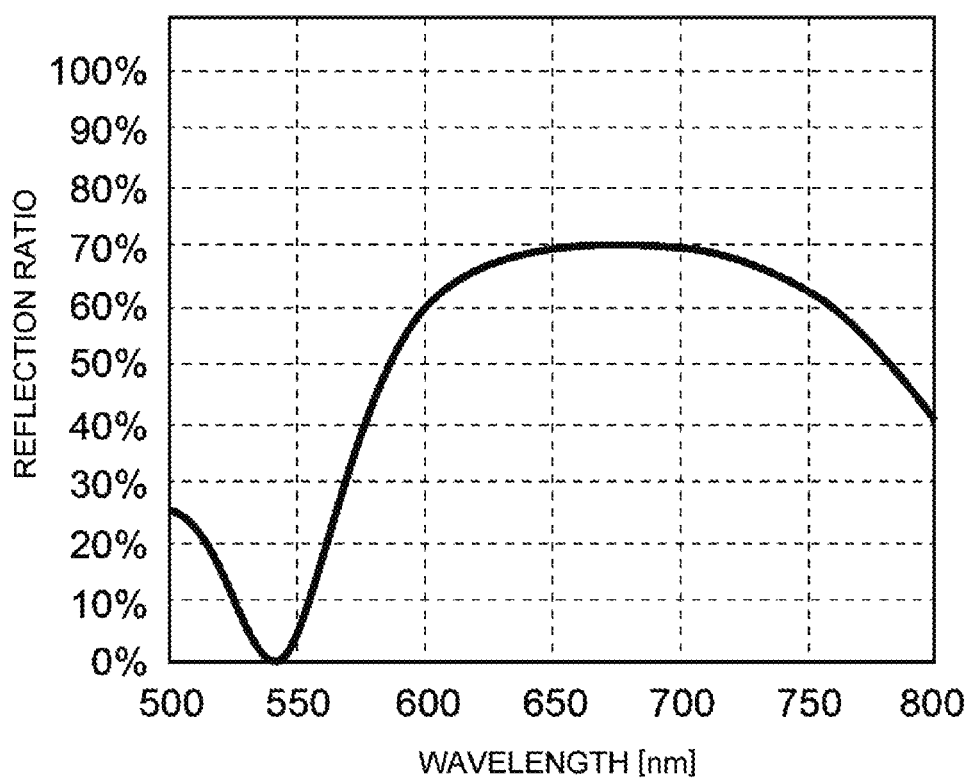
FIG. 15 is a view showing a reflection ratio spectrum according to the first comparative example of the semiconductor laser element.

FIG. 15 shows a reflection ratio spectrum in the Comparative Example 1. According to the Comparative Example 1, the reflection ratios with the wavelengths of 660 nm, 670 nm, and 680 nm were 70.972%, 71.083%, and 70.978%, respectively. Also, the difference in the reflection ratios (maximum value-minimum value) within the wavelength was 0.111%.

Comparative Example 2

The reflective film was made by nine layers, as shown in FIG. 16. More particularly, the reflective film was constituted in a structure having a lowermost $Al_2O_3$ layer ($L_1$ layer), and a periodic structure ($L_2$ layer to $L_9$ layer) in which a high refractive index film ($SiN_x$) and a low refractive index film ($SiO_2$) are alternately layered in four cycles.

The film thickness of each of the $L_1$ layer to $L_8$ layer were set to $\lambda/4n$ [nm]. The film thickness of the $L_9$ layer was set to $\lambda/2n$ [nm]. In other words, the Comparative Example 2 differs from the Comparative Example 1 in that the Comparative Example 2 has a structure having the film thickness of the uppermost layer different from that of the Comparative Example 1.

Figure 17:
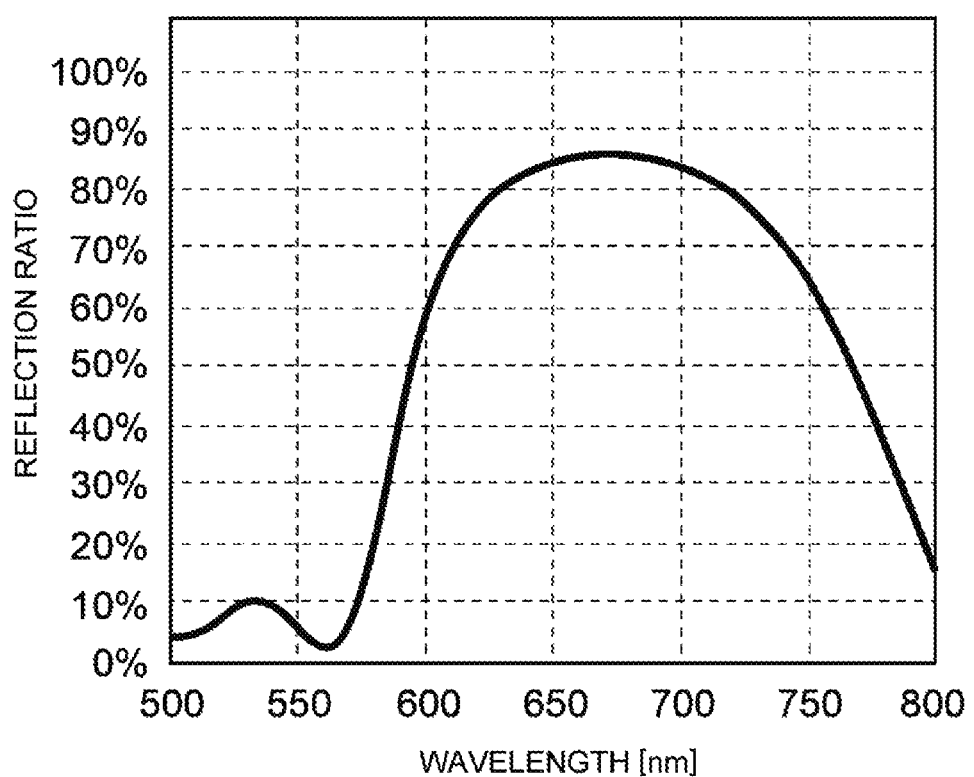
FIG. 17 is a view showing a reflection ratio spectrum according to the second comparative example of the semiconductor laser element.

FIG. 17 shows a reflection ratio spectrum in the Comparative Example 2. According to the Comparative Example 2, the reflection ratios with the wavelengths of 660 nm, 670 nm, and 680 nm were 85.681%, 85.950%, and 85.697%, respectively. Also, the difference in the reflection ratios (maximum value–minimum value) within the wavelength range was 0.269%.

As apparent from the above described measurement results of the reflection ratio, in the Working Examples 1 to 5, as compared to the Comparative Examples 1 and 2, it is observed that the peak of the reflection ratio curve are substantially flat across a broad range of wavelength band. In other words, according to the Working Examples 1 to 5, it was confirmed that the wavelength dependency of the reflection ratio of the reflective film can be suppressed to be smaller.

As described above, in order to allow the peak of the reflection ratio curve to be close to be flat, it is preferable to form the low refractive index film (the first low refractive index film 23) that has the film thickness thinner than $\lambda/4n$ at the lowermost layer, and to form the low refractive index film (the third low refractive index film 26) that has the film thickness of $\lambda/4n$ at the uppermost layer.

When the low refractive index film is single layered and has the film thickness of $\lambda/4n$, then the reflection ratio curve tends to be convex downwardly. For this reason, by arranging the low refractive index film having the film thickness of $\lambda/4n$ at the uppermost layer, it makes it possible to annihilate the reflection ratio curve which tends to be convex upwardly, and to allow the peak of the reflection ratio curve to be close to be flat. This knowledge or presumption can be also apparently rationalized from the measurement result that, in the case in which the low refractive index film having the film thickness of $\lambda/2n$ is arranged at the uppermost layer (the Comparative Example 2 in FIG. 17), the reflection ratio curve has less flatness, as compared to the case in which the low refractive index film having the film thickness of $\lambda/4n$ is arranged at the uppermost layer (the Comparative Example 1 in FIG. 15).

Furthermore, in the Working Examples 1 to 5, as described above, the low refractive index film (the first low refractive index film 23) that has the film thickness thinner than $\lambda/4n$ was formed at the lowermost layer. More particularly, the film thickness of the lowermost layer was more thinly made to be 30 nm with respect to $\lambda/4n$ (that is, approximately 100 nm).

Yet furthermore, in the Working Examples 1 to 5, the low refractive index film (the $L_2$ layer) was formed on the upper face of the lowermost layer (the $L_1$ layer), and the sum of the optical film thickness of the $L_1$ layer and the optical film thickness of the $L_2$ layer was made to be approximately $\lambda/4$. With those layers so configured, it makes it possible to further improve the flatness of the reflection ratio spectrum in more efficient manner as compared to the case in which the low refractive index film having the film thickness of $\lambda/4n$ is merely formed at the uppermost layer (the Comparative Example 1).

Yet furthermore, by forming the $SiO_2$ layer (the $L_2$ layer) that has the lower refractive index than the $L_1$ layer on the upper face of the $Al_2O_3$ layer (the $L_1$ layer), it makes it possible to allow the difference in the refractive indices between the $SiO_2$ layer (the $L_2$ layer) and the high refractive index layer (the $L_3$ layer), which contacts the upper face of the $L_2$ layer, to be greater as far as possible. As a result, it makes it possible to attain the reflective film with the higher reflection ratio.

Yet furthermore, in any of the Working Examples 1 to 5, it was confirmed that the film did not exfoliate and the end face of the element was not deteriorated. This is because the semiconductor laser element is provided with the $Al_2O_3$ layer (the $L_1$ layer) that is made of a material having a linear expansion coefficient close to the linear expansion coefficient of the substrate of the semiconductor laser element as the lowermost layer to be joined to the end face of the resonator. As described above, by constituting the $L_1$ layer with a film having a linear expansion coefficient within ±30% with respect to the linear expansion coefficient of the substrate of the semiconductor laser element, it makes it possible to further improve the reliability of the semiconductor laser element.

In particular, in the Working Examples 1 to 4, although the number of the layers of the reflective films are equal to or greater than ten, it was observed that the films did not exfoliate. As such, even when the number of layers of the reflective films are increased, still the films are assumed not to exfoliate. For this reason, by increasing the number of layers as shown in the Working Examples 1 and 2, it makes it possible to further improve the reflection ratio of the reflective films.

In addition, by selecting the high refractive index films constituting the periodic structure (the $L_3$ layer, the $L_5$ layer, the $L_7$ layer, . . . ) as appropriate, it makes it possible to further improve the reflection ratio as shown in the Working Examples 3 and 4. As a result, it makes it possible to achieve both of suppressing the wavelength dependency of the reflection ratio and improving the reflection ratio simultaneously.

Yet also, for the uppermost layer, both of the $Al_2O_3$ layer as the Working Examples 1 and 2 and the $SiO_2$ layer as the Working Examples 3 to 5 are capable of similarly suppressing the wavelength dependency of the reflection ratio. However, in this regard, when the uppermost layer is constituted with the same material as the low refractive index film constituting the periodic structure (the second low refractive index film 25), it makes it possible to reduce the cost for manufacturing the reflective film.

It should be noted that it is not required for the low refractive index films constituting the periodic structure (the $L_2$ layer, the $L_4$ layer, the $L_6$ layer, . . . ) to be constituted with all the same material. Likewise, it is also not required for the high refractive index films constituting the periodic structure (the $L_3$ layer, the $L_5$ layer, the $L_7$ layer, . . . ) to be constituted with all the same material.

Under the above mentioned assumption, the wavelength dependency of the reflection ratio of the reflective film was further confirmed with a film having a different refractive index (higher refractive index) being inserted into the periodic structure, as the high refractive index film of the periodic structure. As a material constituting the film having a higher refractive index, α-Si (amorphous silicon) was employed.

Working Example 6

The reflective film was made by twelve layers, as shown in FIG. 18. More particularly, the reflective film was constituted in a structure having a lowermost $Al_2O_3$ layer ($L_1$ layer), a periodic structure ($L_2$ layer to $L_{11}$ layer) in which a low refractive index film ($SiO_2$) and a high refractive index film ($SiN_x$ or α-Si) are alternately layered in five cycles, and an uppermost $SiO_2$ layer ($L_{12}$ layer) serving as a low refractive index film. Here, amongst the layers in the periodic structure, the high refractive index film of the $L_{11}$ layer was formed to be the α-Si layer. In other words, the Working Example 6 differs from the Working Example 2 in that the Working Example 6 is a structure having a different materials for the $L_{11}$ layer and the $L_{12}$ layer.

The film thickness of the $L_1$ layer was set to 30.0 [nm] and the film thickness of the $L_2$ layer was set to 84.0 [nm]. In other words, a sum of the optical film thickness of the $L_1$ layer and the optical film thickness of the $L_2$ layer was set to an approximately λ/4 [nm]. The film thickness of each of the $L_3$ layer to $L_{12}$ layer was set to be λ/4n [nm].

Figure 19:
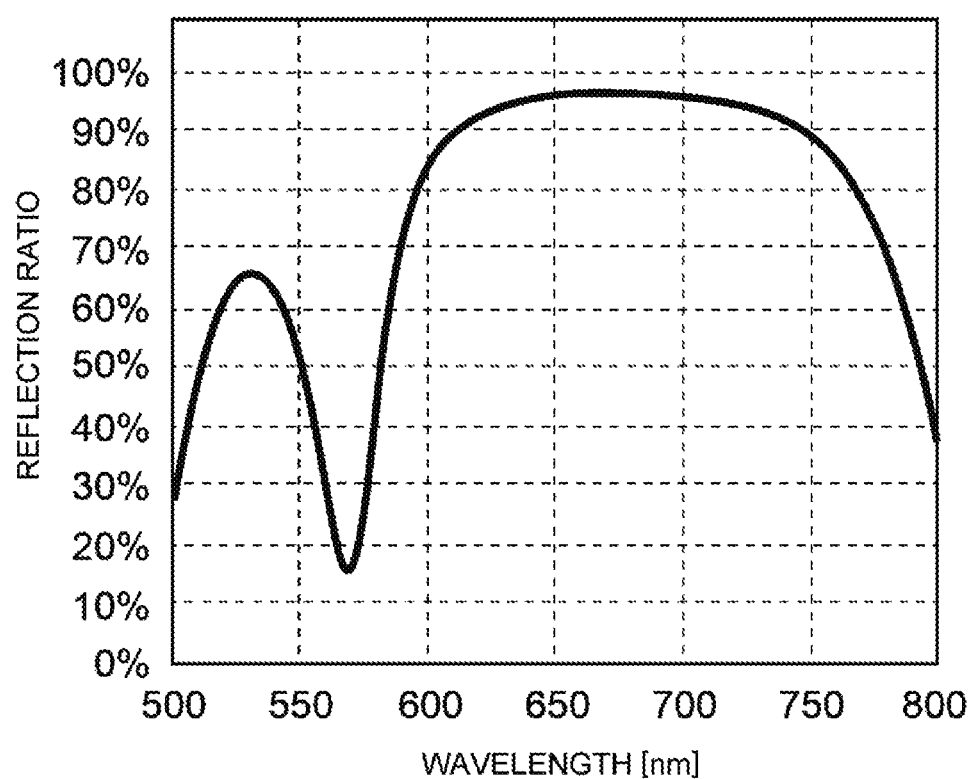
FIG. 19 is a view showing a reflection ratio spectrum according to the sixth working example of the semiconductor laser element.

FIG. 19 shows a reflection ratio spectrum in the Working Example 6. According to the Working Example 6, the reflection ratios with the wavelengths of 660 nm, 670 nm, and 680 nm were 95.974%, 96.065%, and 96.001%, respectively. Also, the difference in the reflection ratios (maximum value−minimum value) within the wavelength range was 0.092%.

Working Example 7

The reflective film was made by twelve layers, as shown in FIG. 20. More particularly, the reflective film was constituted in a structure having a lowermost $Al_2O_3$ layer ($L_1$ layer), a periodic structure ($L_2$ layer to $L_{11}$ layer) in which a low refractive index film ($SiO_2$) and a high refractive index film ($SiN_x$ or α-Si) are alternately layered in five cycles, and an uppermost $SiO_2$ layer ($L_{12}$ layer) serving as a low refractive index film. Here, amongst the layers in the periodic structure, the high refractive index film of the $L_3$ layer was formed to be the α-Si layer. In other words, the Working Example 7 differs from the Working Example 6 in that the Working Example 7 is a structure having a different position of the α-Si layer to be arranged.

The film thickness of the $L_1$ layer was set to 30.0 [nm] and the film thickness of the $L_2$ layer was set to 84.0 [nm]. In other words, a sum of the optical film thickness of the $L_1$ layer and the optical film thickness of the $L_2$ layer was set to an approximately λ/4 [nm]. The film thickness of each of the $L_3$ layer to $L_{12}$ layer was set to be λ/4n [nm].

Figure 21:
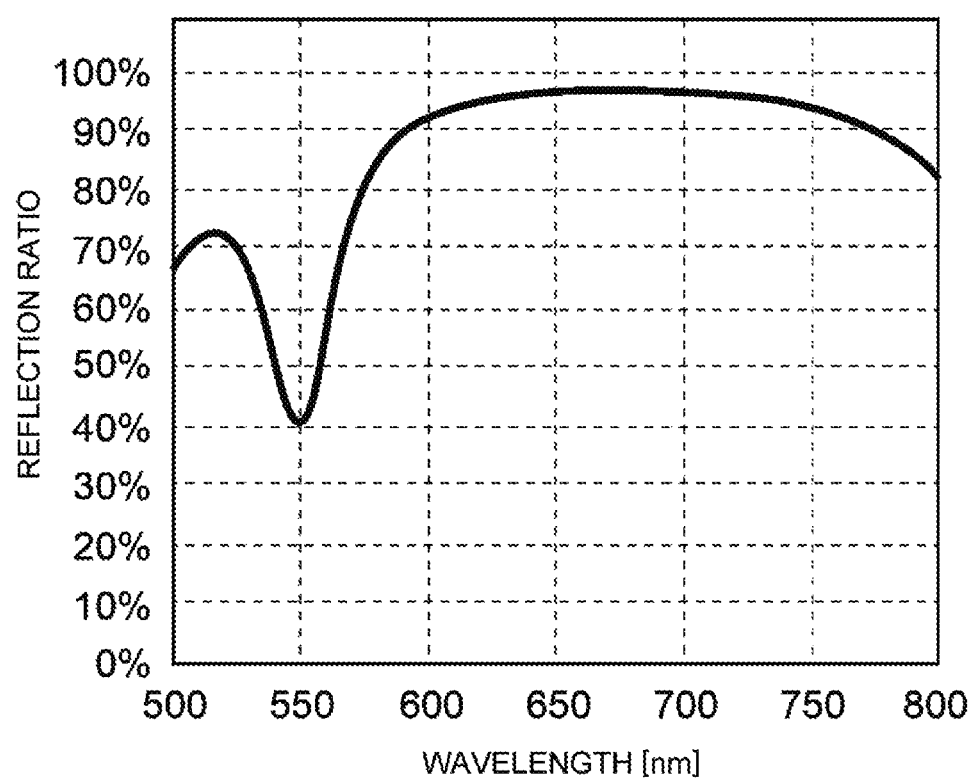
FIG. 21 is a view showing a reflection ratio spectrum according to the seventh working example of the semiconductor laser element.

FIG. 21 shows a reflection ratio spectrum in the Working Example 7. According to the Working Example 7, the reflection ratios with the wavelengths of 660 nm, 670 nm, and 680 nm were 96.024%, 96.065%, and 96.042%, respectively. Also, the difference in the reflection ratios (maximum value−minimum value) within the wavelength was 0.041%.

Comparative Example 3

The reflective film was made by nine layers, as shown in FIG. 22. More particularly, the reflective film was constituted in a structure having a lowermost $Al_2O_3$ layer ($L_1$ layer), and a periodic structure ($L_2$ layer to $L_9$ layer) in which a high refractive index film ($SiN_x$ or α-Si) and a low refractive index film ($SiO_2$) are alternately layered in four cycles. Here, amongst the layers in the periodic structure, the high refractive index film of the $L_8$ layer was formed to be the α-Si layer.

The film thickness of each of the $L_1$ layer to $L_9$ layer was set to be λ/4n [nm].

Figure 23:
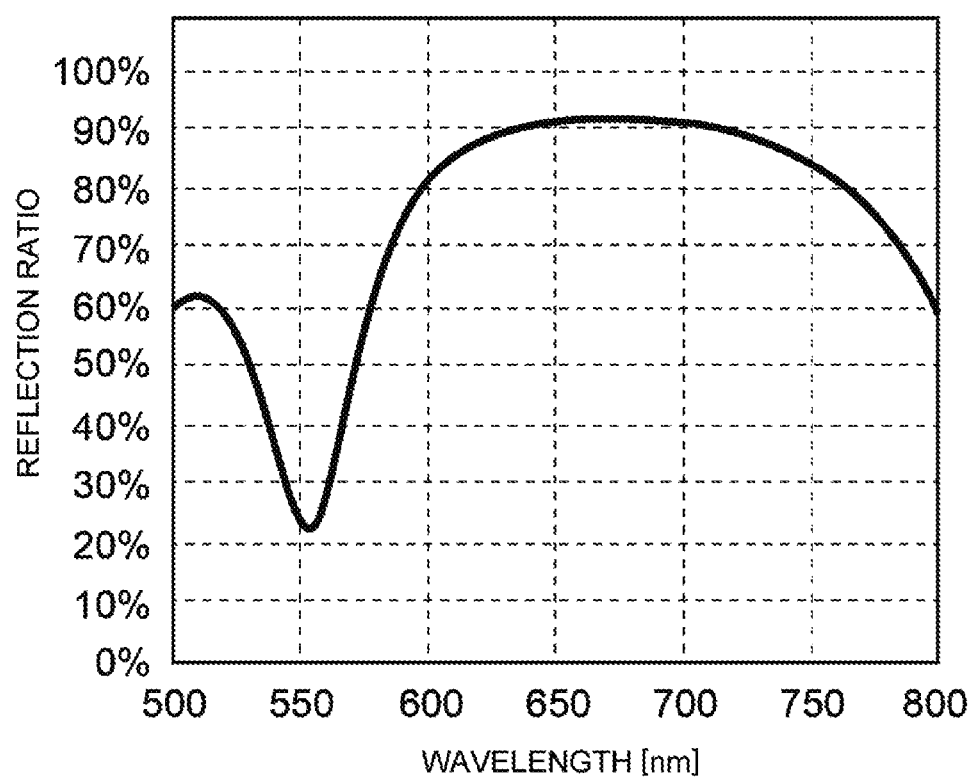
FIG. 23 is a view showing a reflection ratio spectrum according to the third comparative example of the semiconductor laser element.

FIG. 23 shows a reflection ratio spectrum in the Comparative Example 3. According to the Comparative Example 3, the reflection ratios with the wavelengths of 660 nm, 670 nm, and 680 nm were 91.733%, 91.839%, and 91.739%, respectively. Also, the difference in the reflection ratios (maximum value−minimum value) within the wavelength was 0.106%.

As apparent from the above described supplemental measurement results of the reflection ratio, in the Working Examples 6 and 7, as compared to the Comparative Example 3, it is observed that the peak of the reflection ratio curve are substantially flat across a broad range of wavelength band. In other words, according to the Working Examples 6 and 7, it was confirmed that the wavelength dependency of the reflection ratio can be suppressed to be smaller.

In addition, it was also confirmed that the reflection ratio was further improved as compared to the above mentioned Working Example 2. Yet furthermore, it was also confirmed that the reflection ratio can be further improved when the α-Si layer is arranged at a position closer to the end face of the resonator.

A principle to obtain the reflective film by multi-layered films, in which films having a different refractive indices from one another are layered, is in general commonly known (as exemplarily disclosed in the non-Patent Literature 1). When light reaches a boundary surface (interface) between media having different refractive indices from each other, reflection light and transmitted light are generated. When the light transmits (passes through) in the multi-layered films, a reflection and a transmission of the like occur at a plurality of boundary surfaces so that the multiply reflected light and the transmitted light interfere with each other. As a result, the reflective film can be obtained.

Here, the multiple reflection affects more at the end face side of the resonator of the semiconductor. For this reason, the flatness of the reflective ratio spectrum can be further improved when the α-Si layer is arranged at a position closer to the end face of the resonator.

As described above, according to the semiconductor laser element of the above mentioned embodiments, it is confirmed that the change in the reflection ratio can be suppressed across the broad range of the wavelength band.

In this way, according to the semiconductor laser element of the above mentioned embodiments, it makes it possible to suppress the change in the reflection ratio to be small or minimal with respect to the laser oscillation wavelength, while assuring the reliability of the semiconductor laser element. As a result, it makes it possible to suppress the characteristics of the semiconductor laser element, such as the optical output, the slope efficiency, the threshold current, and the monitoring current and the like, from being lowered, which considerably or severely depends on the reflection ratio of the reflective film on the end face.

While certain embodiments have been described, these embodiments have been presented by way of example only, and are not intended to limit the scope of the present invention. The novel apparatuses and methods thereof described herein may be embodied in a variety of other forms. Furthermore, various omissions, substitutions and changes in the form of the apparatuses and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No.

2016-127401, filed on Jun. 28, 2016, and the entire contents of which are incorporated herein by reference.

REFERENCE SIGNS LIST

10: Semiconductor Laser Element
11: Substrate
13: Active Layer
16: First Electrode
17: Second Electrode
18: Ridge Portion
20: Luminous Point
21; 22: Reflective Film
30: Sub-mount

What is claimed is:

1. A semiconductor laser element, comprising:
a substrate;
semiconductor layers being multi-layered, formed on the substrate and configured to include at least an active layer; and
a reflective film constituted with the substrate and the semiconductor layers and provided on at least one of end faces of a resonator,
the reflective film including:
an $L_1$ layer arranged at a first position counting from the one of the end faces of the resonator and having a refractive index of n1; and
a periodic structure configured by layering, on the $L_1$ layer, a plurality of pairs of an $L_{2N}$ layer and an $L_{2N+1}$ layer, the $L_{2N}$ layer being arranged at a $2N^{-th}$ position (where N is a positive integer) counting from the one of the end faces of the resonator and having a refractive index of n2, the $L_{2N+1}$ layer being arranged at a $2N+1^{-th}$ position (where N is a positive integer) counting from the one of the end faces of the resonator and having a refractive index of n3, where n2<n3,
the $L_1$ layer having a linear expansion coefficient within ±30% with respect to a linear expansion coefficient of the substrate and being made of a film having an optical film thickness thinner than $\lambda/4$, and
an $L_2$ layer arranged at a second position counting from the one of the end faces of the resonator being made of a film having an optical film thickness thinner than $\lambda/4$.

2. The semiconductor laser element according to claim 1, wherein a sum of the optical film thickness of the $L_1$ layer and the optical film thickness of the $L_2$ layer is $\lambda/4$ or approximately $\lambda/4$.

3. The semiconductor laser element according to claim 1, further comprising an uppermost layer arranged on the periodic structure and having a refractive index of n4, where n2≤n4<n3.

4. The semiconductor laser element according to claim 1, wherein the optical film thickness of the $L_1$ layer is equal to or greater than 10 nm and equal to or less than 90 nm.

5. The semiconductor laser element according to claim 1, wherein the refractive index of the $L_1$ layer is within a range between 1.5 and 1.8.

6. The semiconductor laser element according to claim 1, wherein the $L_1$ layer is made of alumina ($Al_2O_3$).

7. The semiconductor laser element according to claim 1, wherein the refractive index of the $L_{2N}$ layer is within a range between 1.4 and 3.5.

8. The semiconductor laser element according to claim 7, wherein the $L_{2N}$ layer is made of silicon dioxide ($SiO_2$).

9. The semiconductor laser element according to claim 1, wherein the refractive index of the $L_{2N+1}$ layer is within a range between 1.5 and 4.0.

10. The semiconductor laser element according to claim 9, wherein the $L_{2N+1}$ layer is made of one or more substances selected from a group consisting of silicon nitride ($SiN_x$), zirconium oxide ($ZrO_x$), titanium oxide ($TiO_x$), and amorphous silicon ($\alpha$-Si).

11. The semiconductor laser element according to claim 1, wherein the refractive index of n1 of the $L_1$ layer and the refractive index of n2 of the $L_2$ layer satisfies a relationship expressed by n1>n2.

12. The semiconductor laser element according to claim 1, further comprising:
an uppermost layer arranged on the periodic structure and having a refractive index of n4, where n2≤n4<n3, and
a refractive index of the uppermost layer being within a range between 1.4 and 3.5.

13. The semiconductor laser element according to claim 12, wherein the uppermost layer is made of alumina ($Al_2O_3$).

14. The semiconductor laser element according to claim 1, further comprising:
an uppermost layer arranged on the periodic structure and having a refractive index of n4, where n2≤n4<n3, and
the uppermost layer being made of a same substance as the $L_{2N}$ layer.

15. The semiconductor laser element according to claim 1, wherein a reflection ratio of the reflective film is equal to or greater than 40%.

16. A semiconductor laser device comprising:
the semiconductor laser element according to claim 1; and
a light receiving unit configured to receive laser light emitted from at least one of the end faces of the resonator via the reflective film, and
the semiconductor laser device being controlled by an external controller configured to convert the laser light received by the light receiving unit into a current and to control a current to be fed to the semiconductor laser element based on a value of the current converted.

* * * * *